United States Patent
Bernstein

(10) Patent No.: US 6,323,580 B1
(45) Date of Patent: Nov. 27, 2001

(54) FERROIC TRANSDUCER

(75) Inventor: Jonathan J. Bernstein, Medfield, MA (US)

(73) Assignee: The Charles Stark Draper Laboratory, Inc., Cambridge, MA (US)

(*) Notice: Subject to any disclaimer, the term of this patent is extended or adjusted under 35 U.S.C. 154(b) by 0 days.

(21) Appl. No.: 09/301,188

(22) Filed: Apr. 28, 1999

(51) Int. Cl.$^7$ ................................................... H01L 41/08
(52) U.S. Cl. .................. 310/324; 310/330; 310/359; 310/365; 310/366; 310/334
(58) Field of Search ........................... 310/324, 330–332, 310/334, 366, 358, 359, 365

(56) References Cited

U.S. PATENT DOCUMENTS

| | | | |
|---|---|---|---|
| 2,540,194 | * | 2/1951 | Ellett ................................ 310/330 X |
| 2,540,412 | * | 2/1951 | Adler ................................ 310/330 X |
| 3,114,849 | * | 12/1963 | Poschenrieder ....................... 310/330 |
| 4,638,206 | * | 1/1987 | Tsunooka et al. ................. 310/354 X |
| 5,209,119 | * | 5/1993 | Polla et al. ......................... 310/324 X |
| 5,315,205 | * | 5/1994 | Ohno et al. ........................ 310/366 X |
| 5,488,954 | * | 2/1996 | Sleva et al. ....................... 310/334 X |
| 5,786,655 | * | 7/1998 | Okumura et al. ................. 310/366 X |
| 5,825,119 | * | 10/1998 | Shibata et al. .................... 310/324 X |
| 5,852,337 | * | 12/1998 | Takeuchi et al. ................. 310/324 X |
| 5,862,275 | * | 1/1999 | Takeuchi et al. ................. 310/324 X |
| 5,956,292 | * | 9/1999 | Bernstein .......................... 310/324 X |
| 6,043,587 | * | 3/2000 | Jaenker ............................. 310/366 X |

* cited by examiner

Primary Examiner—Mark O. Budd
(74) Attorney, Agent, or Firm—Iandiorio & Teska

(57) ABSTRACT

An interdigitated electrode ferroic transducer includes a film of ferroic material electrically polarized substantially in the plane of the film; and a set of interdigitated electrodes including at least two electrodes spaced from one another on the same side of the film and disposed at the termini of the polarization field.

30 Claims, 8 Drawing Sheets

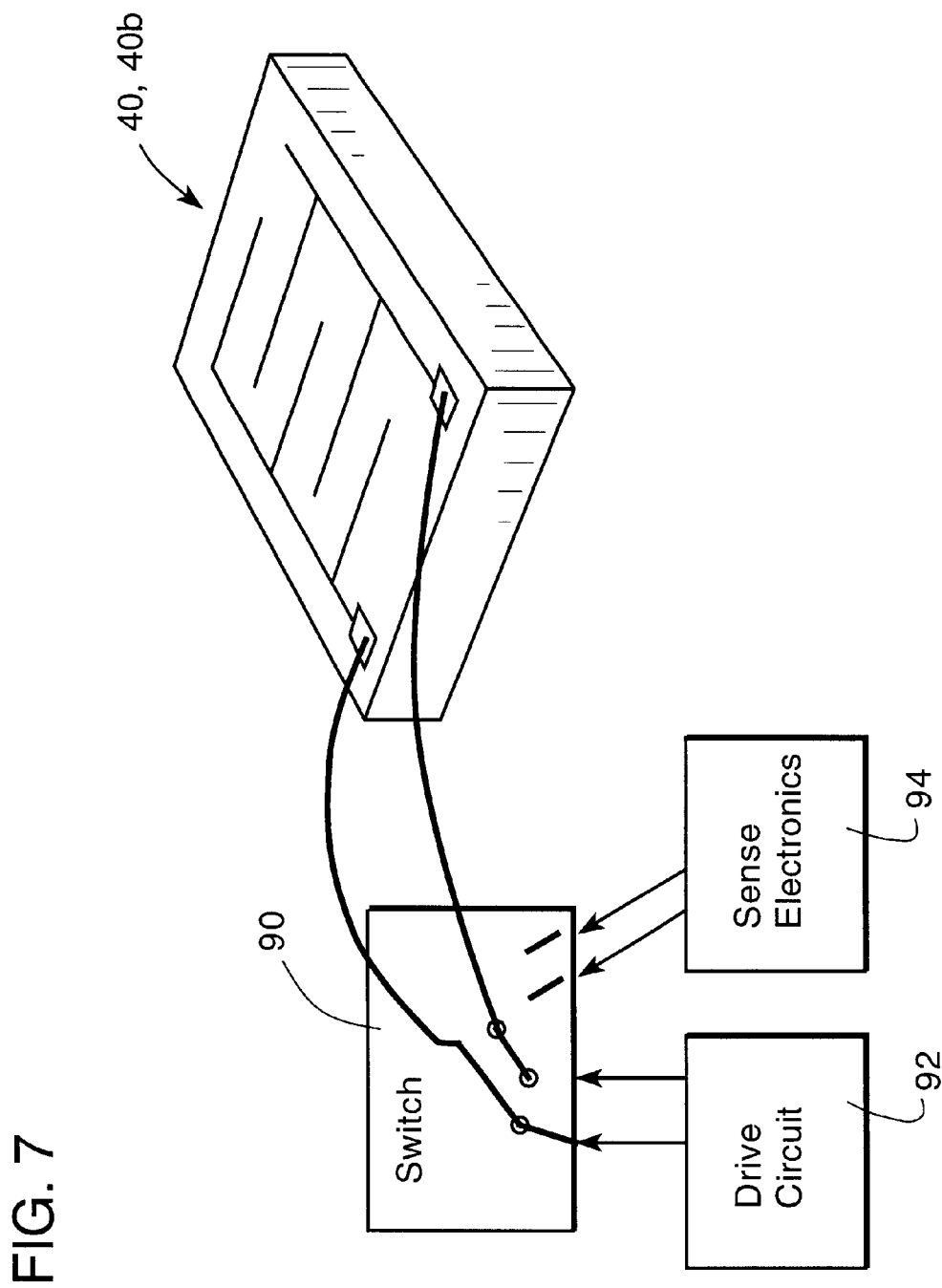

FERROIC TRANSDUCER

FIELD OF INVENTION

This invention relates to an improved ferroic transducer, and more particularly to such a transducer with interdigitated electrodes.

BACKGROUND OF INVENTION

Conventional ferroic transducers employ the ferroic material between a pair of electrodes on opposite sides of the transducer which use the electric field across the thickness of the transducer to convert the acoustic signals into electrical signals and vice versa for underwater or medical sonar use. The term ferroic when used herein includes ferroelectric, pyroelectric and electrostrictive materials. Another application is as a bolometer array for IR imaging using the pyroelectric coefficient of the material. Typically these devices at least in thin film form have low sensitivity. In addition they have high capacitance in the neighborhood of 10–100 pf which is not well matched with present CMOS technology that has input capacitances as low as 0. 1 pf or even less. One attempt to increase sensitivity and decrease capacitance partitions the transducer into many small elements and connects them in series. However, this introduces a number of problems including wasted space, complicated fabrication and increased stray capacitance: the individual elements must be spaced from each other, interlayer connections must be provided and the multitude of individual elements increases stray capacitance.

SUMMARY OF INVENTION

It is therefore an object of this invention to provide an improved ferroic transducer.

It is a further object of this invention to provide such a ferroic transducer with higher sensitivity and lower capacitance.

It is a further object of this invention to provide such a ferroic transducer which requires only a single metal layer.

It is a further object of this invention to provide such a ferroic transducer which requires no multilayer or through-layer electrical connections.

It is a further object of this invention to provide such a ferroic transducer in which all the electrodes are on the same side.

It is a further object of this invention to provide such a ferroic transducer in which the sensitivity can be varied by varying the electrode spacing independent of the thickness of the transducer film.

The invention results from the realization that a ferroic transducer which is simpler and much more sensitive can be achieved by placing all the electrodes on the same side of the ferroic material such as ferroelectric, pyroelectric or electrostrictive material and utilizing the in-plane electric field instead of the cross-plane electric field thereby doubling the ferroelectric receive coefficient and enabling the sensitivity to be increased by increasing the electrode spacing independent of the thickness of the transducer film.

This invention features an interdigitated electrode ferroic transducer including a film of ferroic material electrically polarized substantially in the plane of the film, and a set of interdigitated electrodes including at least two electrodes spaced from one another on the same side of the film and disposed at the termini of the polarization field.

In a preferred embodiment the ferroic material may be a ferroelectric material, a pyroelectric material or an electrostrictive material. There may be more than two electrodes, each one disposed at a terminus of the polarization field. The electrodes may be connected with a drive circuit for generating an acoustic wave output or with a sensing output for sensing an acoustic wave input, or may be connected to both types of circuits to act as both a transmitter and a receiver. The film may be thin film layer, for example, between 0.1 and 10 microns. The electrodes may be straight and parallel to each other or circular and concentric. The transducer may include an insulating layer on the side of the film opposite the electrodes. The insulating layer may be $Al_2O_3$ The transducer may include a structural layer on the side of the insulating layer opposite the film. The structural layer may be made of a material from the group including silicon and polysilicon. There may be a substrate on the side of the structural layer opposite the electrodes. The substrate may be made of silicon. The substrate may include a well on the side opposite the electrode for receiving and/or transmitting acoustic energy to and/or from the film. The substrate may include a closed cavity for providing compliance for receiving and/or transmitting acoustic energy to and from the film. The ferroelectric material may be PZT. The film may include a pyroelectric material. The transducer may include a dielectric layer on the side of the film opposite the electrodes. It may include a conductor ground plane on the side of the dielectric layer opposite the electrodes. It may include a substrate on the side of the ground plane opposite the electrodes. The substrate may be silicon. The substrate may include a well on the side opposite the electrodes for receiving infrared radiation. The transducer may include an infrared absorbing layer in the well. The electrodes may be equally spaced or spaced to provide equal integrals of the electric field and voltage between said electrodes.

The invention also features an imaging array of interdigitated electrode ferroic transducers, each transducer including a film of ferroic material electrically polarized substantially in the plane of the film. There is a set of interdigitated electrodes including at least two electrodes spaced from each other on the same side of the film and disposed at the termini of the polarization field.

DISCLOSURE OF PREFERRED EMBODIMENT

Other objects, features and advantages will occur to those skilled in the art from the following description of a preferred embodiment and the accompanying drawings, in which:

FIG. 7 is a schematic diagram showing the drive circuit and sense electronics for use with an interdigitated electrode ferroic transducer in accordance with this invention which can be used as a transmitter or a receiver;

Throughout this patent application including the background, specification and claims, the term "ferroic" is meant to include ferroelectric, pyroelectric and electrostrictive material. The invention employs an interdigitated readout for a ferroic film, typically a thin film, in the neighborhood of 0.1 to 10 microns. The transducer of this invention provides much higher output voltage and sensitivity because the path length through the material between the electrodes is increased compared to reading out through the thickness of the film in accordance with the prior art. In addition, the fabrication process is simpler since only a single layer of metal is required to read out the device rather than a multilayer metal process with interlayer vias and contacts. Modern CMOS interface circuits can have very low input capacitance on the order of 0.1 pf or less. The optimal transducer for such an interface circuit would have a high sensitivity and an output capacitance matched to the CMOS buffer or approximately 0.1 pf. In general the input capacitance C and sensitivity M for a given transducer can be traded off in such a way that the quantity $M^2C$ is held constant. Using the prior art metal-ferroic-metal sandwich, it is very difficult to match the low-input capacitance for the CMOS buffer since even the small 200 m square by 5 m$^2$ thick transducer has an output capacitance of 100 pf, due to the large dielectric constant of ferroic materials. To decrease the capacitance to 0.1 pf requires splitting such a transducer to thirty smaller transducers and wiring them all in series. Using the interdigitated readout of this invention, the capacitance can be easily decreased to attain the optimum match for the CMOS buffer while improving the sensitivity and output voltage.

Figure 1:
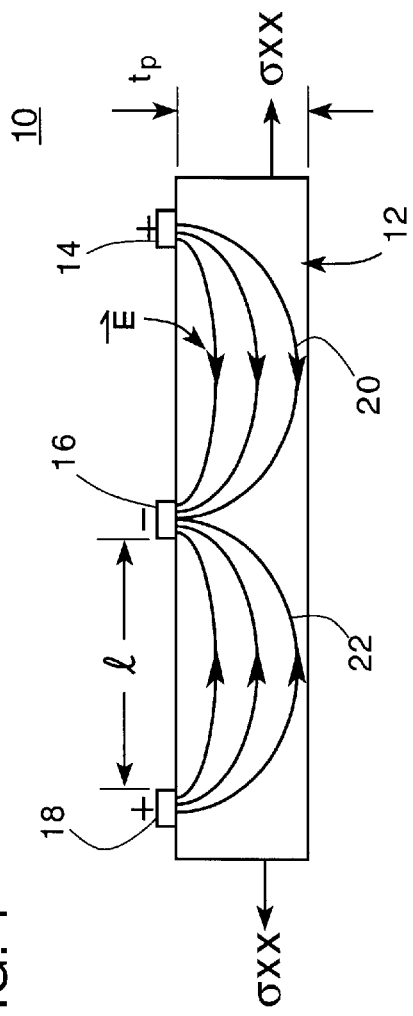
FIG. 1 is a schematic side elevational view of an improved ferroic transducer according to this invention showing the relationship of the electrodes and substantially planar electric field.
Figure 2:
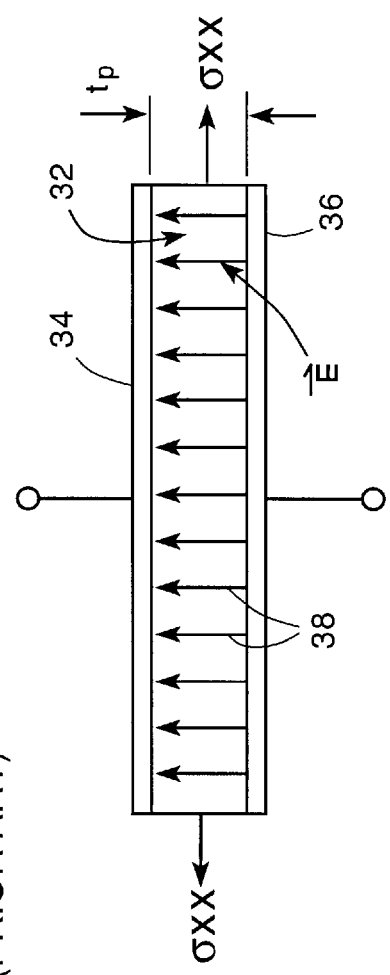
FIG. 2 is a view similar to FIG. 1 of a prior art device.

There is shown in FIG. 1 an interdigitated ferroic transducer 10 according to this invention including a film 12 with interdigitated electrodes 14, 16 and 18. Electrodes 14 and 18 are positive while electrode 16 is negative. Therefore the electric field extends substantially in the plane of film 12 between the positive electrodes 14 and 18 and negative electrode 16. Although there are three electrodes shown in FIG. 1, the invention in the simplest case can work with two interdigitated electrodes. The thickness of the film as indicated as $t_p$ while the in-plane stress is $_{xx}$. Note that the path length of the electric field 1 is approximately equal to the inter-electrode spacing and is wholly independent of the thickness $t_p$ of film 12. Thus the distance 1 can be made much larger than the film thickness $t_p$. Hence a larger voltage sensitivity can be obtained than for the prior art as shown in FIG. 2, which reads out the electric field $E_3$ perpendicular to the film. There the transducer 30 includes a ferroic film 32 which is sandwiched between two planar metal electrodes 34 and 36 and the electric field as indicated by arrows 38 extends across the plane of film 32, not substantially parallel to it. Thus in transducer 10 according to this invention the voltage out is given by $V_{out}=g_{33}1_{xx}$, whereas the voltage out for a prior art device 30, FIG. 2, is given by $V_{out}=g_{31}t_p{}_{xx}$ where $g_{31}$ is the receive coefficient for stress perpendicular to the poling direction, $g_{33}$ is the receive coefficient for stress parallel to the poling direction, $t_p$ is the thickness, and $_{xx}$ is the in-plane average stress in the x direction indicated over the volume of the capacitor transducer. It is known that for common ferroic materials $g_{33}$ is always about twice as large as $g_{31}$ giving the readout an additional 2x higher sensitivity than the prior art. If then the electrode spacing is for example ten times the thickness of the film, the sensitivity of the device 10 can be twenty times larger than that for the prior art device 30.

Table 1 compares the sensitivity of the transducer according to this invention using in-plane polarization and sensing via $g_{33}$ and the former conventional readout of FIG. 2 using $g_{31}$:

TABLE 1

Comparison of Conventional and Invention Readout for a 3 MHz Micromachined Transducer

| | Sensitivity M(V/Pa) | Capacitance C | Figure of Merit: $M^2C$ |
|---|---|---|---|
| Conventional Readout | 0.6 V/Pa | 136 pF | $5*10^{-23}$ |
| Invention Readout | 33 V/Pa | 0.1 pF | $1.2*10^{-22}$ |

For this comparison the identical physical transducer is designed for resonance in water at 3 MHz, with the only difference being the electrode arrangement and direction of poling. The sensor used for comparison has dimensions of 100 m by 340 m with a thickness of 2 m. Only the central half of the diaphragm is electroded. Note that the sensitivity is increased by a factor of 55x in this case which leads to a much higher signal/noise ratio and a greatly reduced minimum detectable signal. In the case of sonar, for example, this translates into greater range, reduced projector power required, or clearer images.

Figure 3:
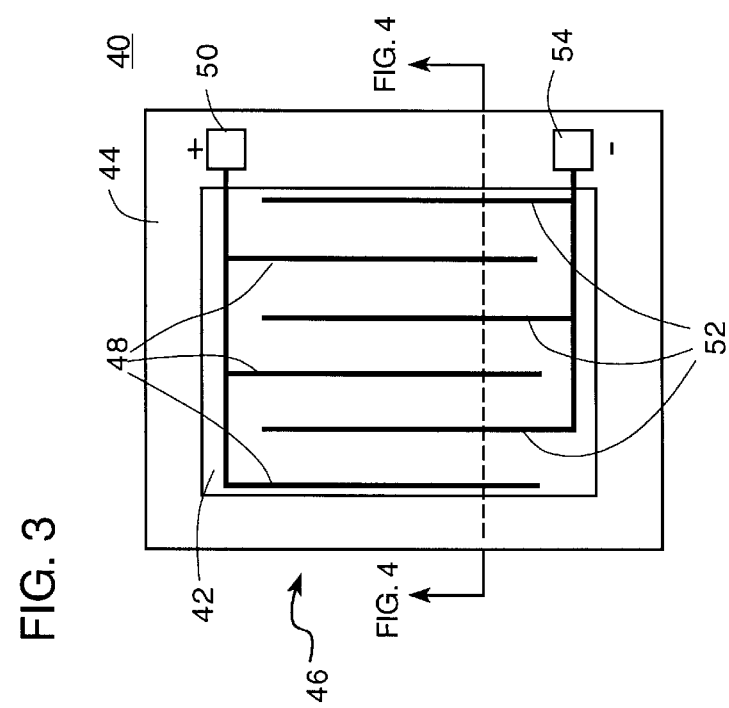
FIG. 3 is a top plan view of an interdigitated electrode ferroic transducer according to this invention.

An interdigitated transducer 40, FIG. 3, according to this invention may use a rectangular ferroic diaphragm 42, for example, a ferroelectric material such as PZT (lead zirconate titanate), PVDF (polyvinylidene defluoride and related polymers), PT (lead titanate), lead metaniobate, BaTiO3 (barium titanate), SrTiO3 (strontium titanate), BST (barium-strontium titanate), and other materials well known to scientists and engineers in the field of ferroelectrics. These materials also function as pyroelectric materials. Electrostrictive materials may also be used. Examples of electrostrictive materials include PMN (lead magnesium niobate), polyurethane, and PMN-PT (lead magnesium niobate—lead titanate solid solutions).

Ferroelectric diaphragm 42 is coated on transducer unit cell 44. The diaphragm has on top of it a set of interdigitated electrodes 46 which in this case includes a set of three electrodes 48 connected to bond pad 50 and three electrodes 52 connected to bond pad 54.

Figure 4:
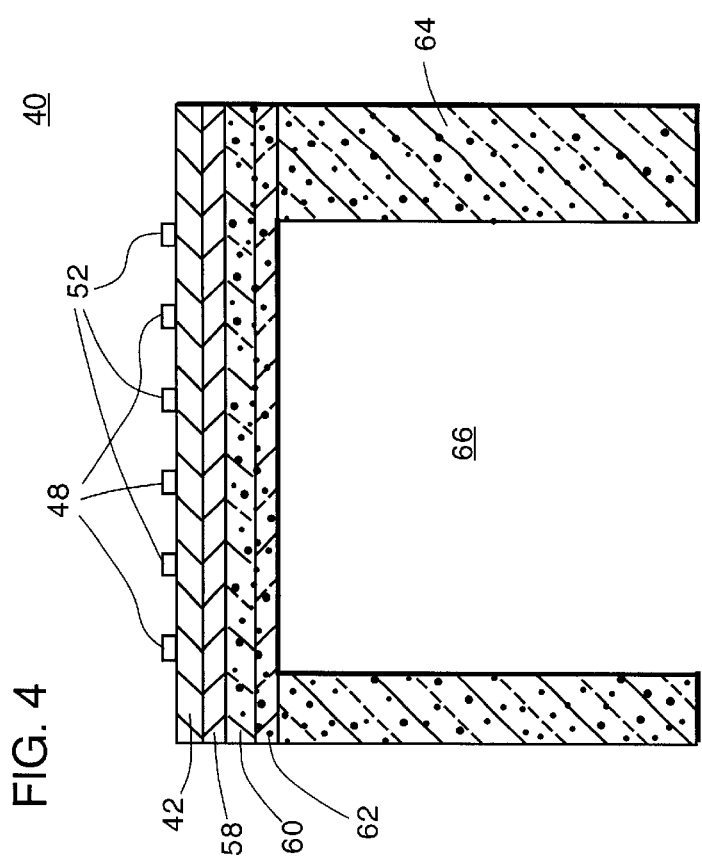
FIG. 4 is a schematic side elevational sectional view along line 4—4 of FIG. 3.

In one construction diaphragm 42 may be made of ferroelectric material such as PZT, FIG. 4, which on its side opposite electrodes 48 and 52 has an insulating layer 58 such as Al$_2$O$_3$ which in turn rests on a structural layer 60 of silicon or polysilicon. An etch stop layer 62 made of SiO$_2$ or Si$_3$N$_4$ may be provided to stop the etching process. The entire structure may sit on a substrate 64 such as a silicon chip in which is etched a hole or recess 66 whereby acoustic energy can exert a force on diaphragm 42 or diaphragm 42 can be driven to provide acoustic energy output through recess 66.

Figure 6:
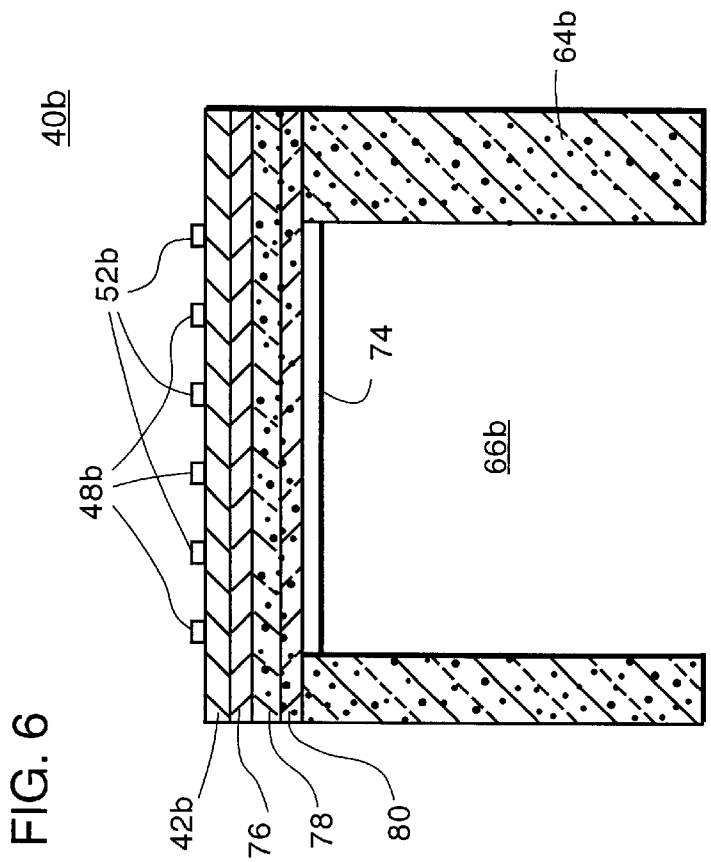
FIG. 6 is a view similar to FIG. 4 of an interdigitated electrode ferroic infrared receiver transducer according to this invention.
Figure 5:
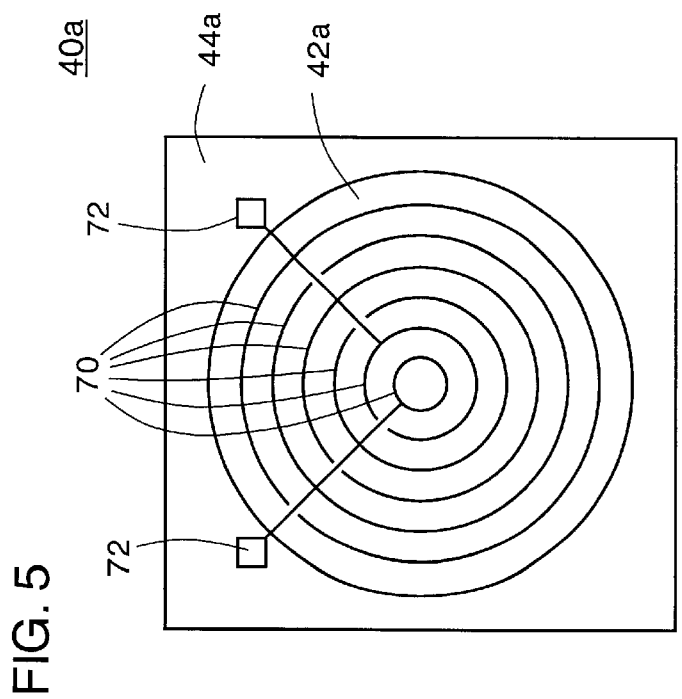
FIG. 5 is a top view of a device similar to FIG. 4 having concentric interdigitated electrodes.

Although the electrodes have been shown as straight and parallel to one another in FIG. 3, this is not a necessary limitation of the invention as they may take any form commensurate with an interdigitated geometry. For example, in FIG. 5 the electrodes 70 are shown as circular and concentric. The interdigitated electrode ferroic transducer may be used to sense infrared radiation. Thus for example, when the diaphragm 42b is a pyroelectric layer such as PZT, PVDF, PT or the like, an IR absorbing layer 74, FIG. 6, may be disposed in well 66b in substrate 64b. Then when the heat generated by the absorption of the infrared in layer 74 causes a temperature change in the pyroelectric diaphragm or layer 42b, that temperature change may be detected by a change in the voltage at electrodes 48b and 52b. The pyroelectric layer 42b may be set on a dielectric layer 76 which rests on conductive ground plane 78 on top of etch stop layer 80. Transducer 40, FIG. 3, can be operated as either a transmitter, a receiver or both, as is common in medical and sonar applications. In that case a switching device 90, FIG. 7, is used to switch the interconnection of the electrodes between a drive circuit 92 which will provide a drive voltage to generate acoustic output energy to be transmitted, and sense electronics 94 which can be used to sense the intensity of incoming acoustic energy or infrared energy.

Figure 8:
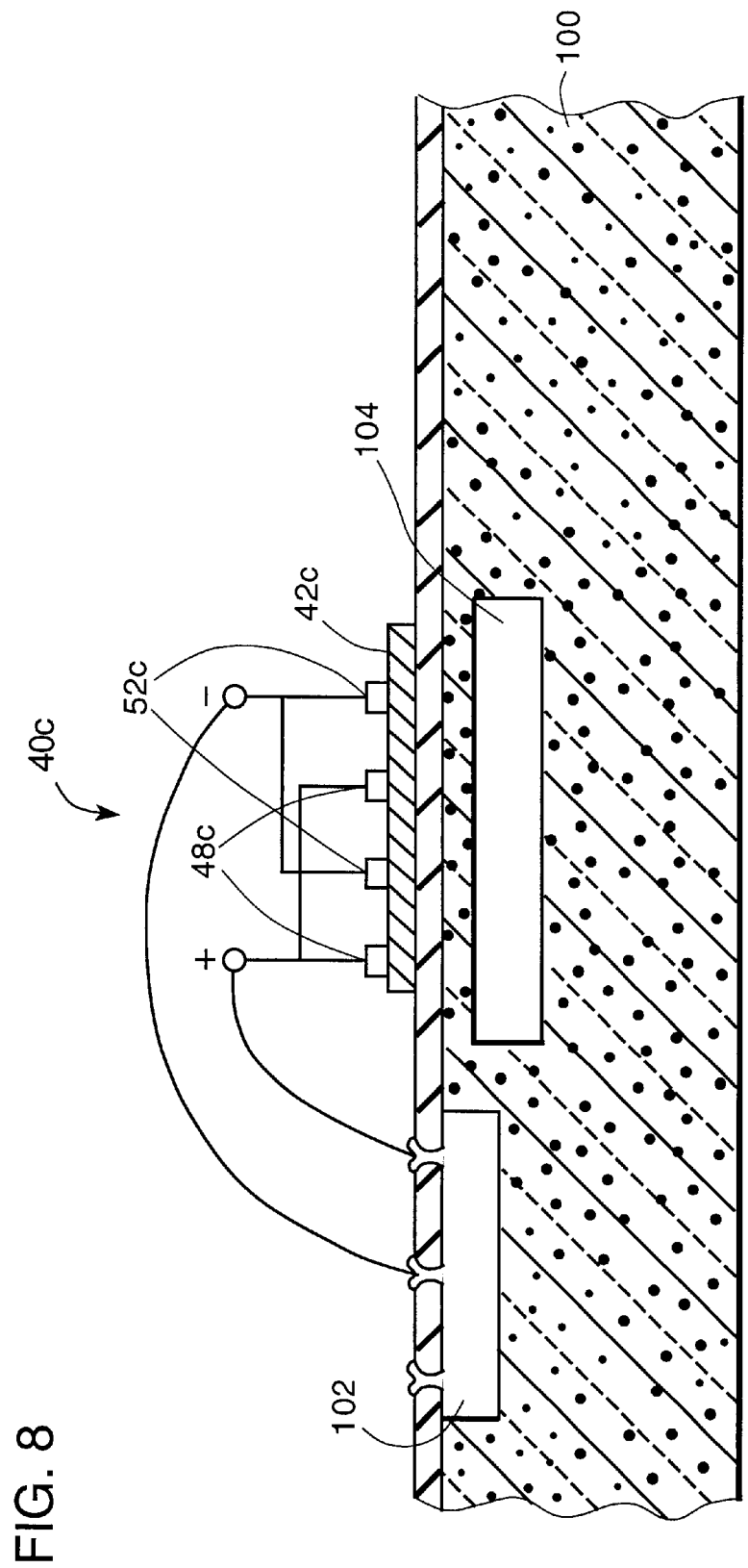
FIG. 8 is a side elevational sectional diagram of a portion of a surface micromachined interdigitated ferroic transducer according to this invention with a micromachined cavity for acoustic compliance and on-chip electronic CMOS circuitry.
Figure 9:
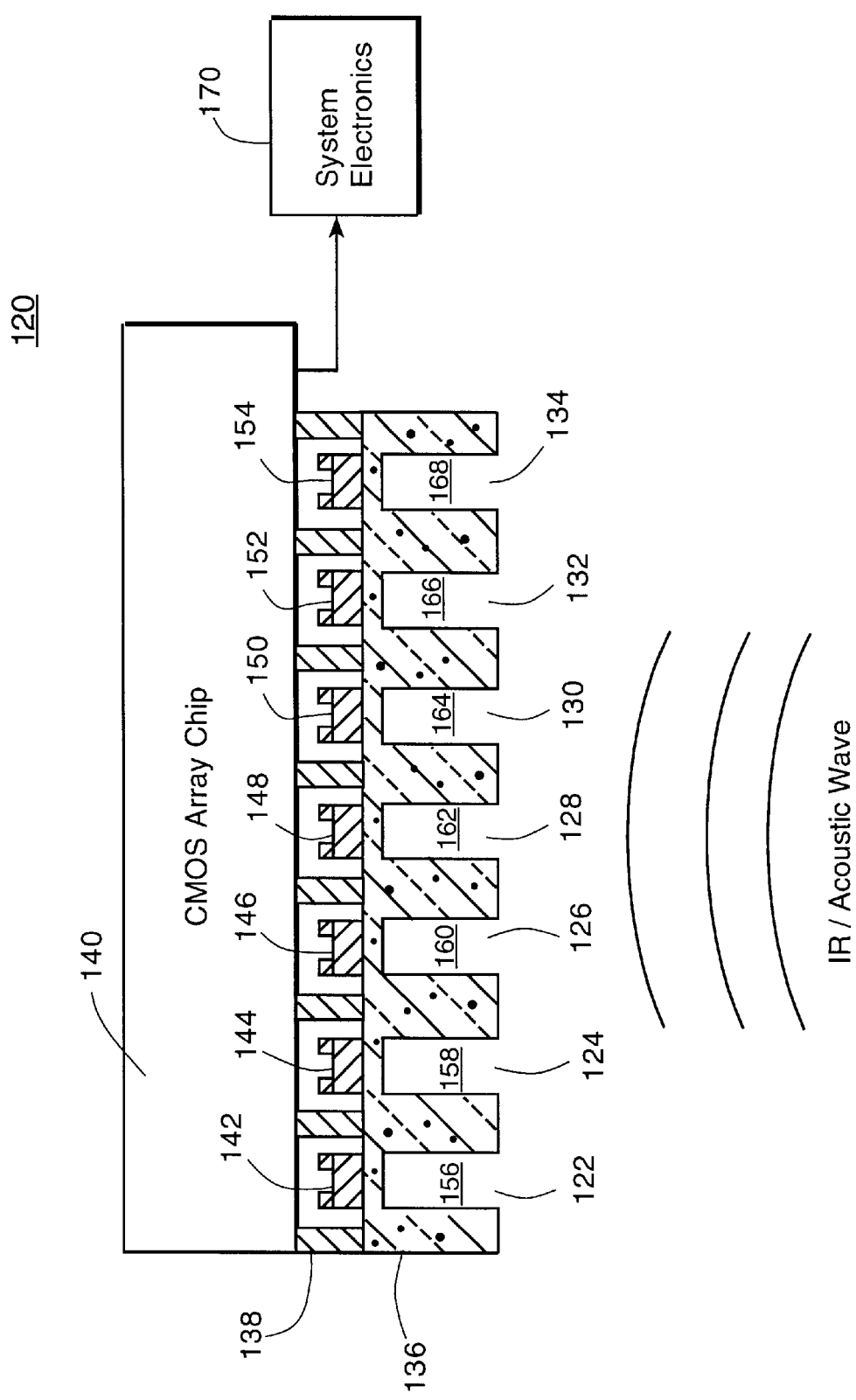
FIG. 9 is a side sectional elevational view of an array of transducers bump bonded to a CMOS electronics array.

An acoustic transducer 40c, FIG. 8, according to this invention, may be fabricated directly on a silicon substrate 100 which contains on board the necessary electronic CMOS circuitry 102 and a micromachined cavity 104 which provides compliance for the transmission or reception of acoustic energy. An entire array 120, FIG. 9, of interdigitated electrode ferroic transducers 122, 124, 126, 128, 130, 132, 134 may be constructed with silicon substrate 136 bump-bonded by bumps 138 to CMOS array chip 140 with the films 142, 144, 146, 148, 150, 152 and 154 facing chip 140 and the wells 156, 158, 160, 162, 164, 166 and 168 facing away for receiving or transmitting acoustic energy or receiving infrared energy. The CMOS array chip after preliminary signal processing provides its output to system electronics 170 for further processing.

Figure 10:
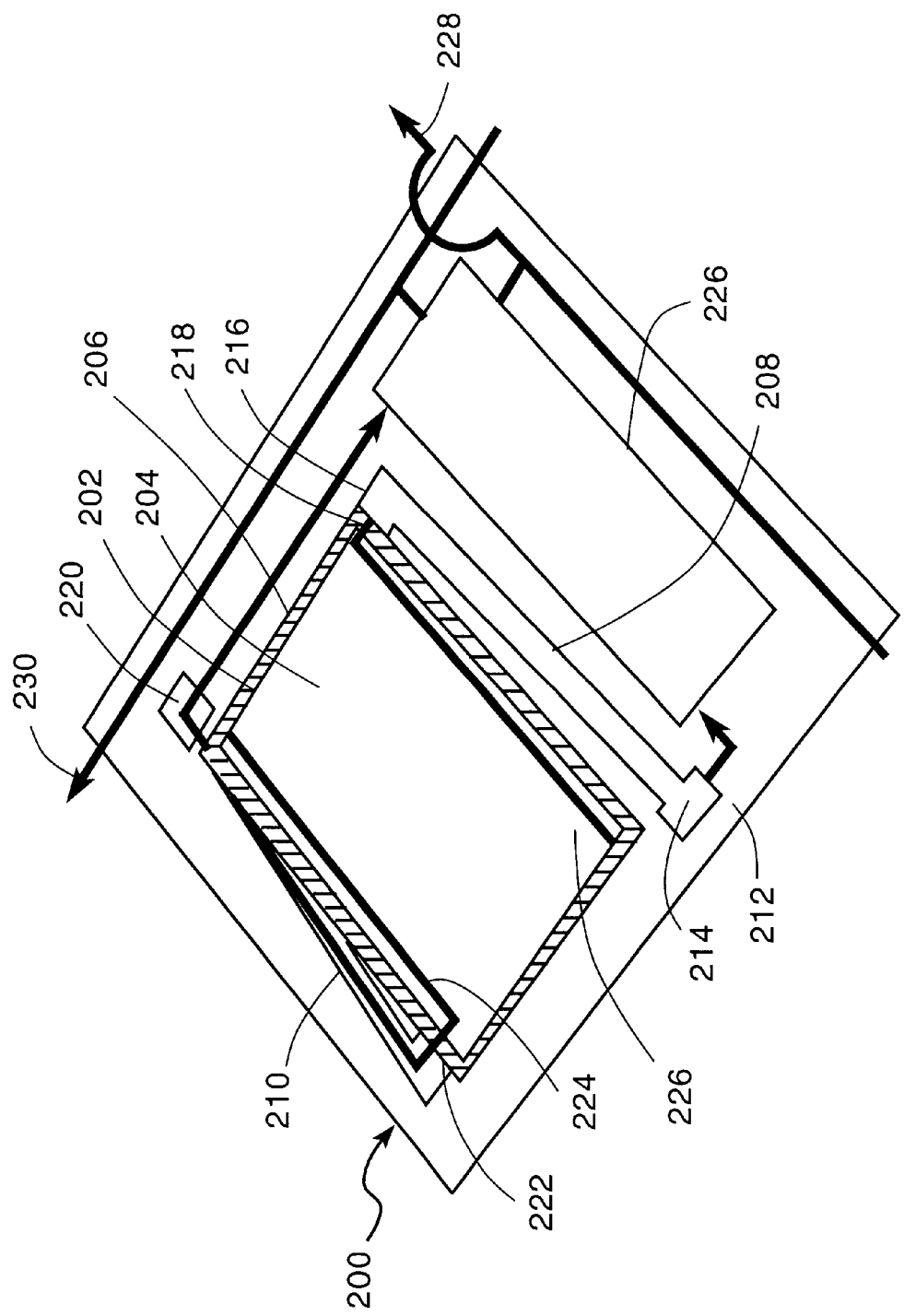
FIG. 10 is a top view of a surface micromachined suspended bolometer pixel using an in-plane pyroelectric element readout and on-chip CMOS buffer and address electronic.

The surface micromachined bolometer pixel using an in-plane pyroelectric element readout and on-chip CMOS buffer and address electronics 200, FIG. 10, includes a suspended pyroelectric bolometer 202 including a pyroelectric film mounted on a support membrane 206 such as $Si_3N_4$. There are a pair of suspension arms 208 and 210. Arm 208 is fastened to the base 212 of cell 200 at contact pad 214 and extends upward away from base 212 so that at its other end 216 it holds end 218 of membrane 206 well above base 212. Arm 210 is similarly connected by contact pad 220 to base 212 and extends upwardly in the other direction to its distal end 222 where it attaches and supports membrane 206 so that the entire membrane 206 containing pyroelectric film 204 floats above base 212. Electrical contact is made by conductive wires that travel up the arms 208 and 210 to the support membrane 206 and then to the pair of in-plane readout electrodes 224 and 226 which are the interdigitated electrodes, numbering only two in this case. The outputs from contact pads 214 and 220 are interconnected with the CMOS, buffer and readout electronics 226 mounted on the same base 212 which is read out or powered by column address bus 228 and row address bus 230.

Figure 11:
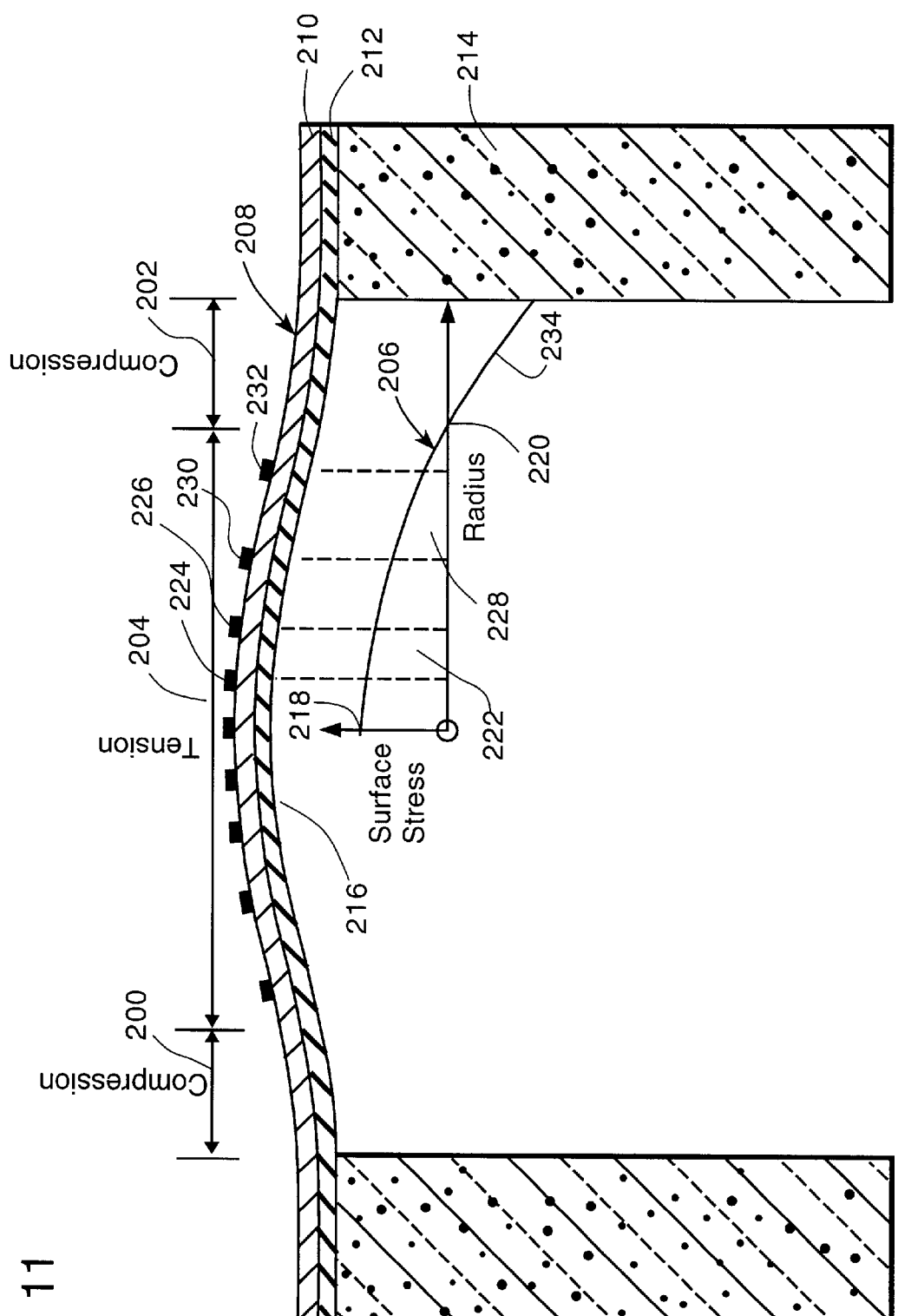
FIG. 11 is a side sectional elevational view in which the finger electrode spacing is varied to produce equal voltage output from adjacent electrical pairs.

To optimize the efficiency of the transducer the finger electrode spacing is varied so that the same voltage is generated between each electrical pair. This might be necessary when, for example, the stress on a diaphragm might not be uniform, hence the electric field (which is proportional to the stress) is non-uniform. Equally spaced finger electrodes would result in some inter-electrical gaps generating larger voltages than other gaps. The net result would be current flowing from one part of the transducer to another part, which is inefficient. High stress regions use closely spaced electrodes, while lower stress regions use electrode fingers further apart. This is shown in FIG. 11, which is a cross-sectional view of a circular or rectangular diaphragm transducer in which the stress in the ferroelectric layer is a function of the distance from the edge of the diaphragm as shown. There are regions of compressive stress 200, 202 and tensile stress 204 as shown by curve 206 for the positive half cycle here a pressure wave is pushing upon diaphragm 208. Diaphragm 208 includes ferroic layer 210 and insulating layer 212 mounted on silicon substrate 214. The stress is maximum at the diaphragm center 210 represented at the beginning 218 of curve 206, and decreases toward the compression regions 200, 202 until a node of zero stress is reached.

The electrical spacing is varied so that the integral under the stress curve between electrodes is constant, e.g., the area 222 between electrodes 224 and 226 is equal to the area 228 between electrodes 230 and 232. This results in substantially equal voltage from each electrode pair.

Although thus far the fingers have been shown equally spaced from one another this is not necessarily so. In some cases the spacing will be varied so that the voltage generated balances so that the voltage generated between each finger pair is substantially equal.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An interdigitated electrode ferroic transducer comprising:
   a continuous thin film of ferroic material electrically polarized substantially in the plane of the film; and
   a set of interdigitated electrodes including at least two electrodes variably spaced from one another on the same side of said film and disposed at the termini of the polarization field.

2. The interdigitated electrode ferroic transducer of claim 1 in which said ferroic material is a ferroelectric material.

3. The interdigitated electrode ferroic transducer of claim 1 in which said ferroic material is a pyroelectric material.

4. The interdigitated electrode ferroic transducer of claim 1 in which said ferroic material is an electrostrictive material.

5. The interdigitated electrode ferroic transducer of claim 1 in which there are more than two electrodes and each is disposed at a terminus of the polarization field.

6. The interdigitated electrode ferroic transducer of claim 1 in which said electrodes are connected with a drive circuit for generating an acoustic wave output.

7. The interdigitated electrode ferroic transducer of claim 1 in which said electrodes are connected with a sensing circuit for sensing an acoustic wave input.

8. The interdigitated electrode ferroic transducer of claim 1 in which said continuous thin film layer is between 0.1 and 10.0 m.

9. The interdigitated electrode ferroic transducer of claim 1 in which said electrodes are straight and parallel to each other.

10. The interdigitated electrode ferroic transducer of claim 1 in which said electrodes are circular and concentric.

11. The interdigitated electrode ferroic transducer of claim 1 in which said transducer includes an insulating layer on the side of said film opposite said electrodes.

12. The interdigitated electrode ferroic transducer of claim 11 in which said insulating layer is $Al_2O_3$.

13. The interdigitated electrode ferroic transducer of claim 1 in which said transducer includes a structural layer on the side of said insulating layer opposite the film.

14. The interdigitated electrode ferroic transducer of claim 13 in which said structural layer is made of material from the group including silicon and polysilicon.

15. The interdigitated electrode ferroic transducer of claim 13 in which said transducer includes a substrate on the side of said structural layer opposite the electrodes.

16. The interdigitated electrode ferroic transducer of claim 15 in which said substrate is silicon.

17. The interdigitated electrode ferroic transducer of claim 15 in which said substrate includes a well on the side opposite the electrodes for receiving and/or transmitting acoustic energy to and/or from the film.

18. The interdigitated electrode ferroic transducer of claim 15 in which said substrate includes a closed cavity for providing compliance for receiving and/or transmitting acoustic energy to/from the film.

19. The interdigitated electrode ferroic transducer of claim 2 in which said ferroelectric material is PZT.

20. The interdigitated electrode ferroic transducer of claim 1 in which said film includes a pyroelectric material.

21. The interdigitated electrode ferroic transducer of claim 20 in which said transducer includes a dielectric layer on the side of the film opposite the electrodes.

22. The interdigitated electrode ferroic transducer of claim 21 in which said transducer includes a conductive ground plane on the side of the dielectric layer opposite the electrodes.

23. The interdigitated electrode ferroic transducer of claim 22 in which said transducer includes a substrate on the side of said ground plane opposite the electrodes.

24. The interdigitated electrode ferroic transducer of claim 23 in which said substrate is silicon.

25. The interdigitated electrode ferroic transducer of claim 23 in which substrate includes a well in the side opposite the electrode for receiving infrared radiation.

26. The interdigitated electrode ferroic transducer of claim 25 in which said transducer includes an infrared absorbing layer in said well.

27. An interdigitated electrode ferroic transducer comprising:

a continuous thin film of ferroic material electrically polarized substantially in the plane of the film;

a set of interdigitated electrodes including at least two electrodes spaced one from another on the same side of said film and disposed at the termini of the polarization field;

a substrate on the side of the film opposite said electrodes said substrate including a well in the side opposite said electrodes; and an infrared absorbing layer in said well.

28. The interdigitated electrode ferroic transducer of claim 27 further comprising a dielectric layer disposed between said film and said substrate.

29. The interdigitated electrode ferroic transducer of claim 28 further comprising a conductive ground plane disposed between said dielectric layer and said substrate.

30. An imaging array of interdigitated electrode ferroic transducers, each transducer comprising:

a continuous film of ferroic material electrically polarized substantially in the plane of the film; and a set of interdigitated electrodes including at least two electrodes variably spaced from each other on the same side of the film and disposed at the termini of the polarization field.

* * * * *